(12) United States Patent
Takahashi et al.

(10) Patent No.: US 12,402,381 B2
(45) Date of Patent: Aug. 26, 2025

(54) SEMICONDUCTOR DEVICE

(71) Applicant: FLOSFIA INC., Kyoto (JP)

(72) Inventors: Isao Takahashi, Kyoto (JP); Kazuyoshi Norimatsu, Kyoto (JP); Takashi Shinohe, Kyoto (JP)

(73) Assignee: FLOSFIA, INC., Kyoto (JP)

( * ) Notice: Subject to any disclaimer, the term of this patent is extended or adjusted under 35 U.S.C. 154(b) by 551 days.

(21) Appl. No.: 17/862,906

(22) Filed: Jul. 12, 2022

(65) Prior Publication Data
US 2024/0021669 A1    Jan. 18, 2024

(51) Int. Cl.
| | | |
|---|---|---|
| H01L 29/04 | (2006.01) | |
| H01L 23/473 | (2006.01) | |
| H10D 62/40 | (2025.01) | |
| H10D 62/80 | (2025.01) | |
| C30B 25/02 | (2006.01) | |
| C30B 29/16 | (2006.01) | |
| H10D 8/60 | (2025.01) | |
| H10D 12/00 | (2025.01) | |
| H10D 30/66 | (2025.01) | |

(52) U.S. Cl.
CPC ......... *H10D 62/405* (2025.01); *H01L 23/473* (2013.01); *H10D 62/80* (2025.01); *C30B 25/02* (2013.01); *C30B 29/16* (2013.01); *H10D 8/60* (2025.01); *H10D 12/441* (2025.01); *H10D 30/668* (2025.01)

(58) Field of Classification Search
CPC ........ H10D 8/60; H10D 62/80; H10D 62/405; H10D 30/668; H10D 12/441; H01L 21/02565; H01L 21/02609; H01L 21/02433; H01L 21/0242
See application file for complete search history.

(56) References Cited

U.S. PATENT DOCUMENTS

| | | | |
|---|---|---|---|
| 2009/0174038 A1 | 7/2009 | Wang | |
| 2010/0006836 A1 | 1/2010 | Koukitu et al. | |
| 2015/0194479 A1 | 7/2015 | Kaneko et al. | |
| 2015/0225843 A1 | 8/2015 | Oda et al. | |
| 2017/0278706 A1* | 9/2017 | Oda | H01L 21/02579 |
| 2018/0061952 A1* | 3/2018 | Tokuda | H10D 62/405 |

(Continued)

FOREIGN PATENT DOCUMENTS

| | | |
|---|---|---|
| JP | 2010-516599 | 5/2010 |
| JP | 2010-232623 | 10/2010 |

(Continued)

OTHER PUBLICATIONS

Kazuhide Kusakabe et al., "Overgrowth of GaN layer on GaN nano-columns by RF-molecular beam epitaxy", Journal of Crystal Growth 237-239 (2002), pp. 988-992.

(Continued)

*Primary Examiner* — Jaehwan Oh
(74) *Attorney, Agent, or Firm* — Wenderoth, Lind & Ponack, L.L.P.

(57) ABSTRACT

Provided is a semiconductor device including: at least a semiconductor layer having a corundum structure, the semiconductor layer including a first surface having at least a first side and a second side shorter than the first side, the first surface being a c-plane or an m-plane, a direction of the first side being a direction of a c-axis or a direction of an m-axis.

13 Claims, 12 Drawing Sheets

(56) References Cited

U.S. PATENT DOCUMENTS

2019/0006472 A1* 1/2019 Matsuda ................. H10D 30/67
2020/0166415 A1* 5/2020 Yagyu .................... H01C 17/18

FOREIGN PATENT DOCUMENTS

| JP | 5343224 | 11/2013 |
| --- | --- | --- |
| JP | 5397794 | 1/2014 |
| JP | 5397795 | 1/2014 |
| JP | 2014-72533 | 4/2014 |
| JP | 2016-098166 | 5/2016 |
| JP | 2016-100592 | 5/2016 |
| JP | 2016-100593 | 5/2016 |
| JP | 2018-82144 | 5/2018 |

OTHER PUBLICATIONS

K. Y. Zang et al. "Defect reduction by periodic SiNx interlayers in gallium nitride grown on Si (111)", Journal of Applied Physics 101, 093502 (2007), pp. 093502-1-093502-4.

* cited by examiner

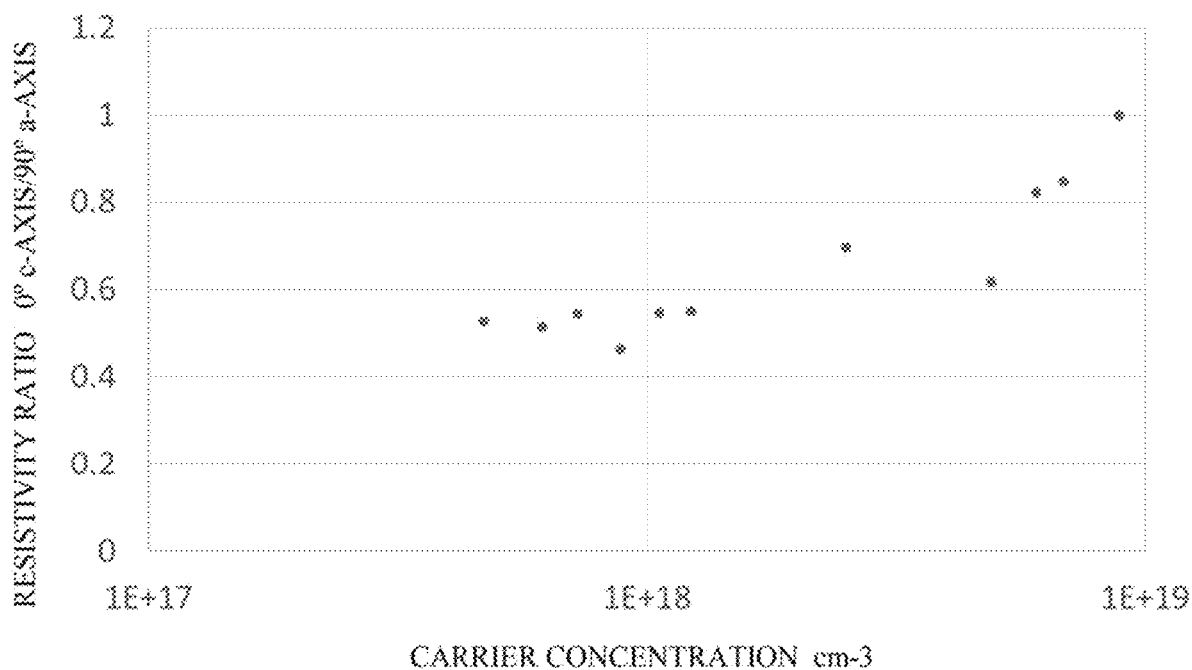

SEMICONDUCTOR DEVICE

1. FIELD OF THE INVENTION

The disclosure relates to a semiconductor device useful, for example, for power devices.

2. DESCRIPTION OF THE RELATED ART

A conventional problem occurring during crystal growth on a heterogeneous substrate is cracks or crystal defect. In response to this problem, consideration has been given to providing conformity between the substrate and the grating constant or thermal expansion coefficient of a film, for example. In response to the occurrence of unconformity therebetween, consideration has also been given to employing a deposition method such as ELO.

According to a known method, a buffer layer is formed on a heterogeneous substrate and crystal growth of a zinc oxide-based semiconductor layer is caused on the buffer layer. Forming a nanodot mask on the heterogeneous substrate and then forming a single-crystal semiconductor material layer is known. There is a known method by which crystal growth of GaN is caused on sapphire through nano-columns of GaN. There is a known method by which defect such as pits is reduced by causing crystal growth of GaN on Si (111) using periodic SiN interlayers.

However, all these techniques find difficulty in obtaining a high-quality epitaxial film for reason of an unsatisfactory deposition speed, the occurrence of a crack, dislocation, distortion, etc. at the substrate, or the occurrence of dislocation or a crack at an epitaxial film. This also causes a hindrance to increasing the diameter of the substrate or increasing the thickness of the epitaxial film.

Attention has been focused on a semiconductor device using gallium oxide ($Ga_2O_3$) having a wide band gap functioning as a next-generation switching element capable of achieving a high withstand voltage, low loss, and high resistance to heat. Application to a power semiconductor device such as an inverter is expected. Furthermore, the wide band gap is also expected to provide applied use as a light emitting and receiving device such as an LED or a sensor. This gallium oxide becomes controllable in band gap by using indium or aluminum alone, or a mixed crystal of indium and aluminum and forms an extremely attractive family of materials as InAlGaO-based semiconductors. Here, the InAlGaO-based semiconductors indicate $In_XAl_YGa_ZO_3$ ($0 \leq X \leq 2$, $0 \leq Y \leq 2$, $0 \leq Z \leq 2$, $X+Y+Z=1.5$ to $2.5$) and may be regarded as a family of materials including gallium oxide.

However, as gallium oxide has a β-Gallia structure in the most stable phase, depositing a crystal film having a corundum structure is difficult unless a particular deposition method is used. Hence, a large number of problems are still left in terms of crystal quality, etc.

SUMMARY OF THE INVENTION

According to an example of the present disclosure, there is provided a semiconductor device including: at least a semiconductor layer having a corundum structure, the semiconductor layer including a first surface having at least a first side and a second side shorter than the first side, the first surface being a c-plane or an m-plane, a direction of the first side being a direction of a c-axis or a direction of an m-axis.

Thus, a semiconductor device of the disclosure is excellent in semiconductor characteristics, particularly in electrical characteristics.

BRIEF DESCRIPTION OF THE DRAWINGS

FIG. 15 is a view illustrating result of a test example 3.

DETAILED DESCRIPTION

Figure 1:
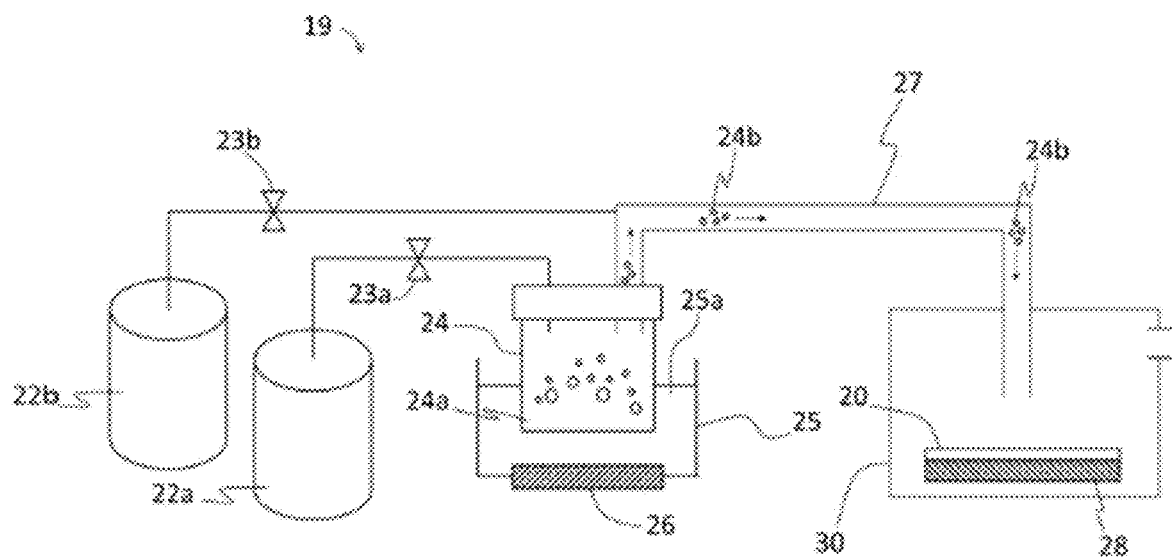
FIG. 1 is a schematic configuration view of a deposition apparatus preferably used in the disclosure.

The inventors of the present disclosure found out that electrical characteristics of the semiconductor device including a semiconductor layer containing gallium oxide with a corundum structure have anisotropy in relation to a direction of current flows, not a principal plane of the semiconductor layer. The inventors of the present disclosure have successfully created a semiconductor device including: at least a semiconductor layer having a corundum structure, the semiconductor layer including a first surface having at least a first side and a second side shorter than the first side, the first surface being a c-plane or an m-plane, a direction of the first side being a direction of a c-axis or a direction of an m-axis, and found out that the semiconductor device may solve the above-mentioned conventional problems.

Embodiments of the present disclosure will be described below with reference to the accompanying drawings. In the following description, the same parts and components are designated by the same reference numerals. The present embodiment includes, for example, the following disclosures.

[Structure 1]

A semiconductor device including: at least a semiconductor layer having a corundum structure, the semiconductor layer including a first surface having at least a first side and a second side shorter than the first side, the first surface being a c-plane or an m-plane, a direction of the first side being a direction of a c-axis or a direction of an m-axis.

[Structure 2]

The semiconductor device according to [Structure 1], wherein the semiconductor layer contains a metal oxide including at least one metal selected from gallium, indium, rhodium, and iridium.

[Structure 3]

The semiconductor device according to [Structure 1], wherein the semiconductor layer contains a metal oxide including at least gallium as a major component.

[Structure 4]

The semiconductor device according to any one of [Structure 1] to [Structure 3], wherein the semiconductor layer has a carrier concentration of equal to or less than $1 \times 10^{19}/cm^3$.

[Structure 5]

The semiconductor device according to any one of [Structure 1] to [Structure 4], wherein the first surface is a c-plane.

[Structure 6]

The semiconductor device according to any one of [Structure 1] to [Structure 5], wherein the semiconductor device is a power device.

[Structure 7]

The semiconductor device according to [Structure 6], wherein the semiconductor device is a power module, an inverter, or a converter.

[Structure 8]

The semiconductor device according to [Structure 6], wherein the semiconductor device is a power card.

[Structure 9]

The semiconductor device according to [Structure 8], further including: a cooler and an insulating member, the cooler being provided on each of both sides of the semiconductor layer across at least the insulating member.

[Structure 10]

The semiconductor device according to [Structure 9], wherein a heat dissipation layer is provided on each of the both sides of the semiconductor layer, and the cooler is provided external to the heat dissipation layer across at least the insulating member.

[Structure 11]

A semiconductor system including a semiconductor device, the semiconductor device being the semiconductor device according to any one of [Structure 1] to [Structure 10].

A semiconductor device according to the disclosure is a semiconductor device including at least a semiconductor layer having a corundum structure. The semiconductor layer includes a first surface having at least a first side and a second side shorter than the first side. The first surface is a c-plane or an m-plane. A direction of the first side is a direction of a c-axis or a direction of an m-axis. According to the disclosure, while the semiconductor layer preferably has a rectangular shape as viewed from a vertex direction, it is not particularly limited in terms of a ratio between a long side and a short side, etc.

According to an embodiment of the disclosure, the semiconductor layer contains a metal oxide including at least one metal selected from gallium, indium, rhodium, and iridium.

According to an embodiment of the disclosure, the semiconductor layer contains a metal oxide including at least gallium as a major component. This achieves more excellent semiconductor characteristics in terms of increasing a withstand voltage, etc. The term "major component" herein means that the metal oxide has a content in terms of an atomic ratio of equal to or greater than 50% to all components in the semiconductor layer, means that the content is preferably equal to or greater than 70%, more preferably, equal to or greater than 90% in terms of an atomic ratio, and means that an atomic ratio may be 100% according to one embodiment. The metal oxide preferably includes at least gallium, indium, rhodium, or iridium. The metal oxide also preferably includes gallium, indium or/and aluminum. The metal oxide including at least gallium is more preferable as it achieves more excellent characteristics as a power device in terms of switching characteristics, for example. According to the disclosure, the first surface is preferably a c-plane as it achieves more excellent electrical characteristics.

Preferably, the semiconductor layer is a crystalline oxide semiconductor layer and contains a crystalline oxide semiconductor. The crystalline oxide semiconductor contains the metal oxide and preferably, includes at least gallium like in the above-described case, more preferably, includes gallium oxide and a mixed crystal of gallium oxide as a major component. According to the disclosure, while the crystalline oxide semiconductor is not particularly limited in terms of crystal structure, etc., the crystalline oxide semiconductor preferably contains a metal oxide having a corundum structure as a major component. While the metal oxide is not particularly limited, the metal oxide preferably includes one or two or more types of metals at least from the fourth period to the sixth period of the periodic table. The metal oxide more preferably includes at least gallium, indium, rhodium, or iridium, and most preferably, includes gallium. According to the disclosure, the metal oxide preferably includes gallium and indium or/and aluminum. Examples of the metal oxide including gallium include α-$Ga_2O_3$ or a mixed crystal of α-$Ga_2O_3$. The semiconductor layer including such a preferred metal oxide as a major component is provided with more excellent crystallinity and more excellent heat dissipation performance, and this might result in more excellent semiconductor characteristics. If the metal oxide is α-$Ga_2O_3$, for example, α-$Ga_2O_3$ may be contained in the semiconductor layer in such a manner that gallium in the semiconductor layer has an atomic ratio of equal to or greater than 50% to all the metal components in the semiconductor layer. According to the disclosure, the atomic ratio of gallium in the metal elements in the semiconductor layer is preferably equal to or greater than 70%, more preferably, equal to or greater than 80% to all the metal components in the semiconductor layer. The semiconductor layer may be a single crystal or a poly crystal. The semiconductor layer is generally in a film shape. However, the semiconductor layer is not particularly limited but may be a plate shape or a sheet shape unless it interferes with the present disclosure.

The semiconductor layer may contain a dopant. The dopant is not particularly limited unless it interferes with the present disclosure. The dopant may be an n-type dopant or a p-type dopant. Examples of the n-type dopant include tin, germanium, silicon, titanium zirconium, vanadium, and niobium. A carrier concentration is properly settable, and more specifically, may be from about $1 \times 10^{16}$ to about $1 \times 10^{22}/cm^3$, for example. The carrier concentration may be set to a low concentration of equal to or less than about $1 \times 10^{17}/cm^3$, for example. In addition, as an example of an embodiment, a carrier concentration in the semiconductor layer may be set to a high concentration of equal to or greater than $1\times10^{20}/\text{cm}^3$, for example. In an embodiment of the disclosure, however, reducing a carrier concentration in the semiconductor layer provides anisotropy more effectively to provide more favorable semiconductor characteristics. Thus, the carrier concentration is preferably set equal to or less than $1\times10^{19}/\text{cm}^3$, more preferably, equal to or less than $5\times10^{18}/\text{cm}^3$, most preferably, equal to or less than $1\times10^{18}/\text{cm}^3$.

The semiconductor layer may be obtained by a preferred deposition method described next, for example. For example, the semiconductor layer may be obtained by forming the semiconductor layer through epitaxial crystal growth by mist CVD method or mist epitaxy method conducted in such a manner that the second electrode extends further than a first electrode at least in a first direction and that the first direction becomes a direction of a c-axis or a direction of an m-axis in the semiconductor layer while using a crystal substrate with a second side shorter than a first side, and then by providing the semiconductor device.

<Crystal Substrate>

The crystal structure is not particularly limited but may be a publicly-known substrate unless it interferes with the present disclosure. The crystal substrate may be an insulator substrate, a conductive substrate, or a semiconductor substrate. The crystal substrate may be a single-crystal substrate or a poly-crystal substrate. For example, the crystal substrate is a substrate containing a crystal substance having a corundum structure as a major component. The term "major component" herein means that the substrate contains the crystal substance in terms of a composition ratio of equal to or greater than 50%, preferably equal to or greater than 70%, more preferably, equal to or greater than 90%. Examples of the crystal structure having the corundum structure include a sapphire substrate and an a-type gallium oxide substrate.

According to the disclosure, the crystal substrate is preferably a sapphire substrate. Examples of the sapphire substrate include a c-plane sapphire substrate, an m-plane sapphire substrate, an a-plane sapphire substrate, and an r-plane sapphire substrate. The sapphire substrate may have an off-angle. While the off-angle is not particularly limited and may be equal to or greater than 0.01°, for example, it is preferably equal to or greater than 0.2°, more preferably, from 0.2° to 12°. The sapphire substrate has a crystal growth plane that is preferably a c-plane. The sapphire substrate is also preferably a c-plane sapphire substrate having an off-angle of equal to or greater than 0.2°.

While the thickness of the crystal substrate is not particularly limited, it is generally from 10 μm to 20 mm, more preferably, from 10 to 1000 μm.

According to the disclosure, control may be exerted on a direction of crystal growth, etc. in the semiconductor layer using an ELO mask in such a manner that the second side becomes shorter than the first side, a linear thermal expansion coefficient in a direction of a first crystal axis becomes lower than a linear thermal expansion coefficient in a direction of a second crystal axis, a direction of the first side becomes parallel or substantially parallel to the direction of the first crystal axis, and a direction of the second side becomes parallel or substantially parallel to the direction of the second crystal axis.

Examples of a preferred shape of the crystal substrate include a triangle, a quadrilateral (a rectangle or a trapezoid, for example), a polygon such as a pentagon or a hexagon, a U-shape, an inverted U-shape, an L-shape, and a channel-shape.

According to the disclosure, a different layer such as a buffer layer or a stress relief layer may be provided on the crystal substrate. For example, the buffer layer is a layer made of a metal oxide having the same crystal structure as the crystal structure of the crystal substrate or the semiconductor layer. For example, the stress relief layer is an ELO mask layer.

Means of the epitaxial crystal growth is not particularly limited but may be publicly-known means unless it interferes with the present disclosure. Examples of the means of the epitaxial crystal growth include CVD method, MOCVD method, MOVPE method, mist CVD method, mist epitaxy method, MBE method, HVPE method, pulse growth method, and ALD method. According to the disclosure, the means of the epitaxial crystal growth is preferably mist CVD method or mist epitaxy method.

The mist CVD method or the mist epitaxy method is conducted by atomizing a raw material solution containing metal (atomization step), causing droplets to float, carrying resultant atomized droplets to a vicinity of the crystal substrate with a carrier gas (carrying step), and then causing a thermal reaction of the atomized droplets (deposition step).

(Raw Material Solution)

The raw material solution is not particularly limited as long as it contains metal as a deposition raw material and it is available for atomization. The raw material solution may contain an inorganic material or an organic material. The metal may be metal as a single element or a metal compound and is not particularly limited unless it interferes with the present disclosure. Examples of the metal include one or two or more types of metals selected from gallium (Ga), iridium (Ir), indium (In), rhodium (Rh), aluminum (Al), gold (Au), silver (Ag), platinum (Pt), copper (Cu), iron (Fe), manganese (Mg), nickel (Ni), palladium (Pd), cobalt (Co), ruthenium (Ru), chromium (Cr), molybdenum (Mo), tungsten (W), tantalum (Ta), zinc (Zn), lead (Pb), rhenium (Re), titanium (Ti), tin (Sn), magnesium (Mg), calcium (Ca), and zirconium (Zr). According to the disclosure, the metal preferably includes one or two or more types of metals at least from the fourth period to the sixth period of the periodic table, more preferably, includes at least gallium, indium, rhodium, or iridium. According to the disclosure, the metal also preferably includes gallium, and indium or/and aluminum. Using such a preferred metal makes it possible to deposit the semiconductor layer usable preferably in a semiconductor device, etc.

According to the disclosure, a solution containing the metal, in a form of complex or salt, dissolved or dispersed in an organic solvent or water may be used preferably as the raw material solution. Examples of the form of the complex include an acetylacetonate complex, a carbonyl complex, an ammine complex, and a hydride complex. Examples of the form of the salt include an organic metal salt (e.g., metal acetate, metal oxalate, metal citrate, etc.), metal sulfide, metal nitrate, phosphorylated metal, and metal halide (e.g., metal chloride, metal bromide, metal iodide, etc.).

A solvent of the raw material solution is not particularly limited unless it interferes with the present disclosure. The solvent may be an inorganic solvent such as water, an organic solvent such as alcohol, or a mixed solvent of the inorganic solvent and the organic solvent. According to the disclosure, the solvent preferably includes water.

Furthermore, the raw material solution may contain a mixed additive such as a hydrohalic acid or an oxidant. Examples of the hydrohalic acid include hydrobromic acid, hydrochloric acid, and hydroiodic acid. Examples of the oxidant include peroxide such as hydrogen peroxide ($H_2O_2$), sodium peroxide ($Na_2O_2$), barium peroxide ($BaO_2$), and benzoyl peroxide ($(C_6H_5CO)_2O_2$), hypochlorous acid (HClO), perchloric acid, nitric acid, ozone water, and an organic peroxide such as peracetic acid and nitrobenzene.

The raw material solution may contain a dopant. The dopant is not particularly limited unless it interferes with the present disclosure. Examples of the dopant include n-type dopants. The n-type dopants may include tin, germanium, silicon, titanium, zirconium, vanadium and niobium. Also, examples of the dopant include p-type dopants. The dopant has a concentration that may, in general, be approximately in a range from $1\times10^{16}$ to $1\times10^{22}/cm^3$. The dopant concentration may be at a lower concentration of, for example, approximately equal to or less than $1\times10^{17}/cm^3$. In addition, according to the disclosure, the dopant may be contained at a high concentration of, for example, approximately equal to or greater than $1\times10^{20}/cm^3$.

(Atomization Step)

At the atomization step, the raw material solution containing the metal is adjusted, the raw material solution is atomized, droplets are caused to float, and then the atomized droplets are generated. While the ratio of the mixed metal is not particularly limited, it is preferably from 0.0001 mol/L to 20 mol/L to the raw material solution in its entirety. Means of the atomization is not particularly limited and may be publicly-known atomization means as long as it is available for atomization of the raw material solution. According to the disclosure, the atomization means preferably uses ultrasonic vibration. Mist used in the disclosure is to float in the air and is not to be blown like a spray, for example. More preferably, the mist has a zero initial velocity, is to float in the space, and is carriable as a gas. The droplet size of the mist is not particularly limited and may be a droplet of about several millimeters, but is preferably equal to or less than 50 μm, more preferably, from 1 to 10 μm.

(Carrying Step)

At the carrying step, the atomized droplets are carried to the substrate by using the carrier gas. The type of the carrier gas is not particularly limited unless it interferes with the disclosure. Preferred examples of the carrier gas include oxygen, ozone, an inert gas (such as nitrogen or argon, for example), and a reduction gas (such as hydrogen gas or forming gas). Further, the carrier gas may contain one or two or more types of gas. Also, a diluted gas (e.g., 10-fold diluted gas) and the like changed in carrier gas concentration may be further used as a second carrier gas. A location for supplying the carrier gas is not limited to one but the carrier gas may be supplied from two or more locations. While the flow rate of the carrier gas is not particularly limited, it is preferably equal to or less than 1 LPM, more preferably, from 0.1 to 1 LPM.

(Deposition Step)

At the deposition step, a reaction of the atomized droplets is caused to deposit a film on the crystal substrate. The reaction is not particularly limited as long as it is to form a film from the atomized droplets. According to the disclosure, a thermal reaction is preferred. The thermal reaction is simply required to be a reaction of the atomized droplets using heat. Conditions, etc. for the reaction are not particularly limited unless they interfere with the present disclosure. At this step, the thermal reaction is generally conducted at a temperature equal to or higher than an evaporation temperature of the solvent of the raw material solution. Preferably, this temperature does not exceed an excessively high temperature and more preferably, it is equal to or less than 650° C. The thermal reaction may be conducted in any atmosphere such as a vacuum atmosphere, a non-oxygen atmosphere, a reducing gas atmosphere, or an oxygen atmosphere, or may be conducted in any condition such as being under atmospheric pressure, under increased pressure, or under a reduced pressure unless they interfere with the present disclosure. According to the disclosure, the thermal reaction is preferably conducted under an atmospheric pressure in terms of facilitating calculation of an evaporation temperature, simplifying equipment, etc. Furthermore, a film thickness is settable through adjustment of a deposition time.

A deposition apparatus 19 preferably used in the disclosure will be described below by referring to the drawings. The deposition apparatus 19 in FIG. 1 includes: a carrier gas source 22a to supply a carrier gas; a flow control valve 23a for controlling the flow rate of the carrier gas supplied from the carrier gas source 22a; a carrier gas (diluted) source 22b to supply a carrier gas (diluted); a flow control valve 23b for controlling the flow rate of the carrier gas (diluted) supplied from the carrier gas (diluted) source 22b; a mist generator 24 containing a raw material solution 24a; a container 25 containing water 25a; an ultrasonic transducer 26 attached to the bottom surface of the container 25; a deposition chamber 30; a supply pipe 27 made of quartz forming connection from the mist generator 24 to the deposition chamber 30; and a hot plate (heater) 28 installed in the deposition chamber 30. A substrate 20 is placed on the hot plate 28.

As illustrated in FIG. 1, the raw material solution 24a is stored in the mist generator 24. Next, the substrate 20 is placed on the hot plate 28 and the hot plate 28 is actuated to increase a temperature in the deposition chamber 30. Next, the flow control valve 23 (23a, 23b) is opened to supply the carrier gas from the carrier gas source 22 (22a, 22b) into the deposition chamber 30. After an atmosphere in the deposition chamber 30 is sufficiently replaced with the carrier gas, the flow rate of the carrier gas and the flow rate of the carrier gas (diluted) are controlled. Next, the ultrasonic transducer 26 is vibrated and resultant vibration is propagated through the water 25a to the raw material solution 24a. By doing so, the raw material solution 24a is atomized to generate atomized droplets 24b. The atomized droplets 24b are introduced into the deposition chamber 30 using the carrier gas and carried to the substrate 20. Then, the atomized droplets 24b cause a thermal reaction in the deposition chamber 30 under atmospheric pressure to form a film (semiconductor layer) on the substrate 20.

Figure 2:
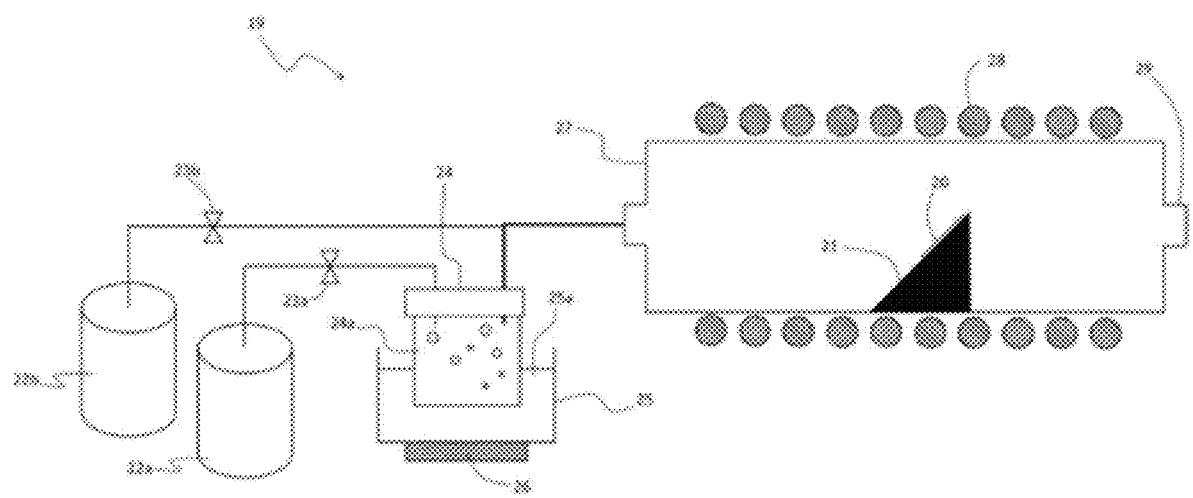
FIG. 2 is a schematic configuration view of a deposition apparatus (mist CVD) preferably used in the disclosure according to a different embodiment from FIG. 1.

Using a mist CVD apparatus (deposition apparatus) 19 illustrated in FIG. 2 is also preferred. The mist CVD apparatus 19 in FIG. 2 includes: a susceptor 21 on which a substrate 20 is placed; carrier gas supply means 22a to supply a carrier gas; a flow control valve 23a for controlling the flow rate of the carrier gas supplied from the carrier gas supply means 22a; carrier gas (diluted) supply means 22b to supply a carrier gas (diluted); a flow control valve 23b for controlling the flow rate of the carrier gas supplied from the carrier gas (diluted) supply means 22b; a mist generator 24 containing a raw material solution 24a; a container 25 containing water 25a; an ultrasonic transducer 26 attached to the bottom surface of the container 25; a supply pipe 27 having an inner diameter of 40 mm made of quartz pipe; a heater 28 installed around the supply pipe 27; and an exhaust port 29 for ejection of mist, droplets, and exhaust gas after a thermal reaction. The susceptor 21 is made of quartz and has a surface for placement of the substrate 20 that is slanted off a horizontal plane. Using quartz both for forming the supply pipe 27 and the susceptor 21 as a deposition chamber reduces the occurrence of mixture of impurity derived from the apparatus into a film to be formed on the substrate 20. The mist CVD apparatus 19 may be handled in the same way as the deposition apparatus 19 described above.

Using the preferred deposition apparatuses described above makes it possible to form the semiconductor layer more easily on a crystal growth surface of the crystal substrate. The semiconductor layer is generally formed through epitaxial crystal growth.

The above-described semiconductor layer is useful for semiconductor devices, particularly useful for power devices. Examples of the semiconductor device formed by using the above-described crystalline oxide semiconductor include a transistor such as an MIS transistor or an HEMT or a TFT, a Schottky barrier diode using a semiconductor-metal junction, a JBS, a PN or PIN diode using a combination with another P layer, and a light emitting and receiving element. According to the disclosure, the crystalline oxide semiconductor becomes available in the semiconductor device by being removed from the crystal substrate, if needed. The semiconductor layer is also usable by being placed on a substrate having higher thermal conductivity than the crystal substrate.

The semiconductor device is preferably used both in a lateral element (lateral device) with an electrode formed on the side of one surface of a semiconductor layer and in a vertical element (vertical device) with electrodes formed both on the side of a front surface and the side of a back surface of a semiconductor layer. According to the disclosure, the semiconductor device is particularly preferably used in the vertical device. Preferred examples of this semiconductor device include a Schottky barrier diode (SBD), a junction barrier Schottky diode (JBS), a metal semiconductor field-effect transistor (MESFET), a high electron mobility transistor (HEMT), a metal oxide semiconductor field-effect transistor (MOSFET), a static induction transistor (SIT), a junction field-effect transistor (JFET), an insulated gate bipolar transistor (IGBT), and a light-emitting diode (LED).

The following describes preferred examples of the semiconductor device including the n-type semiconductor layer ($n^+$-type semiconductor layer or $n^-$-type semiconductor layer, for example) of a rectangular shape having a principal plane along a c-axis and having a lengthwise direction along an m-axis by referring to the drawings. However, the disclosure is not limited to these examples.

Figure 6:
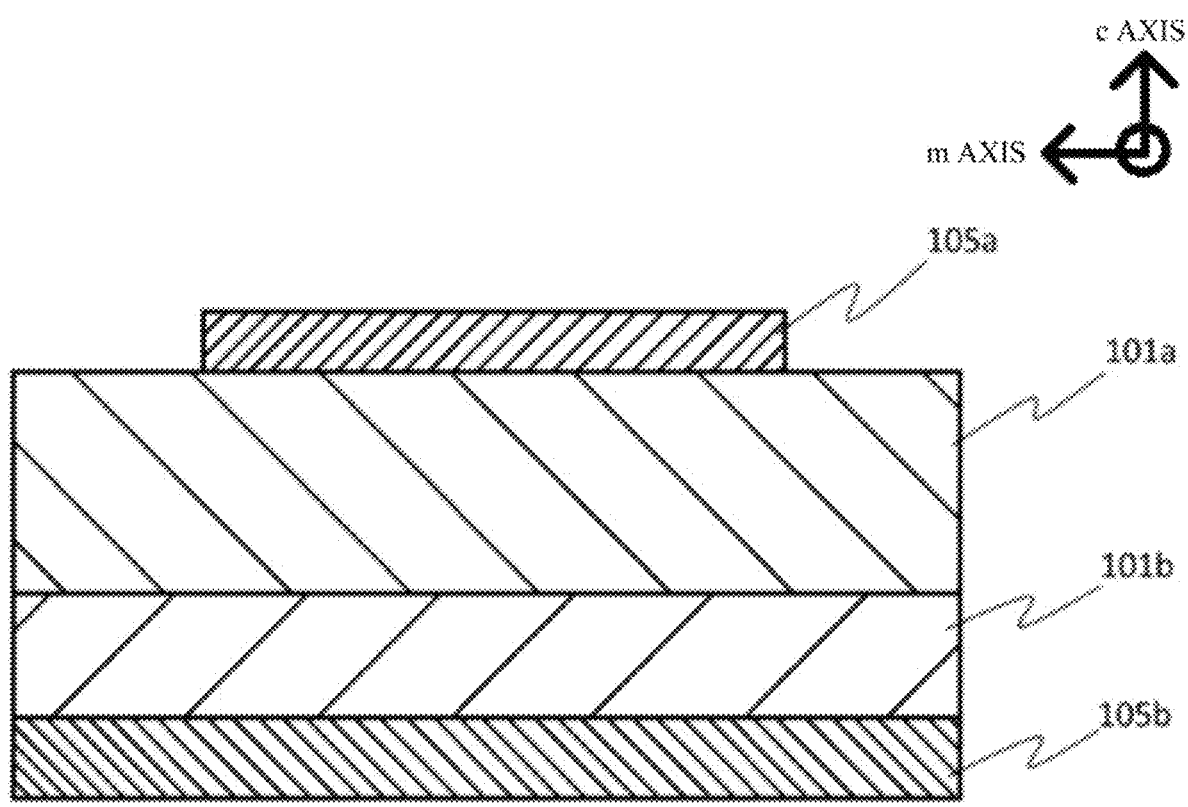
FIG. 6 is a view schematically illustrating a preferred example of a Schottky barrier diode (SBD) using a rectangular semiconductor layer and illustrating a sectional view in a lengthwise direction.

FIG. 6 illustrates an example of a Schottky barrier diode (SBD) according to the disclosure. The SBD in FIG. 6 includes an $n^-$-type semiconductor layer 101a, an $n^+$-type semiconductor layer 101b, a Schottky electrode 105a, and an Ohmic electrode 105b.

A material of each of the Schottky electrode and the Ohmic electrode may be a publicly-known electrode material. Examples of this electrode material include metals such as Al, Mo, Co, Zr, Sn, Nb, Fe, Cr, Ta, Ti, Au, Pt, V, Mn, Ni, Cu, Hf, W, Ir, Zn, In, Pd, Nd, and Ag, alloys of these metals, conductive films made of metal oxides such as tin oxide, zinc oxide, rhenium oxide, indium oxide, indium tin oxide (ITO), and indium zinc oxide (IZO), organic conductive compounds such as polyaniline, polythiophene, and polypyrrole, and mixtures and multilayer structures thereof.

The Schottky electrode and the Ohmic electrode may be formed by publicly-known means such as vacuum evaporation or sputtering, for example. More specifically, in forming the Schottky electrode using two types of metals including a first metal and a second metal from the above-listed metals, a layer made of the first metal and a layer made of the second metal are stacked. Then, patterning using photolithography is performed on the layer made of the first metal and the layer made of the second metal, thereby forming the electrode.

In response to application of a reverse bias to the SBD in FIG. 6, a depletion layer (not illustrated) extends in the n-type semiconductor layer 101a to provide the SBD with a high withstand voltage. Furthermore, application of a forward bias causes electrons to flow from the Ohmic electrode 105b into the Schottky electrode 105a. In this way, the SBD using the above-described semiconductor structure achieves excellence for purposes of high withstand voltage and high current, achieves high switching speed, and achieves excellence in withstand voltage characteristics and reliability. (MOSFET)

Figure 7:
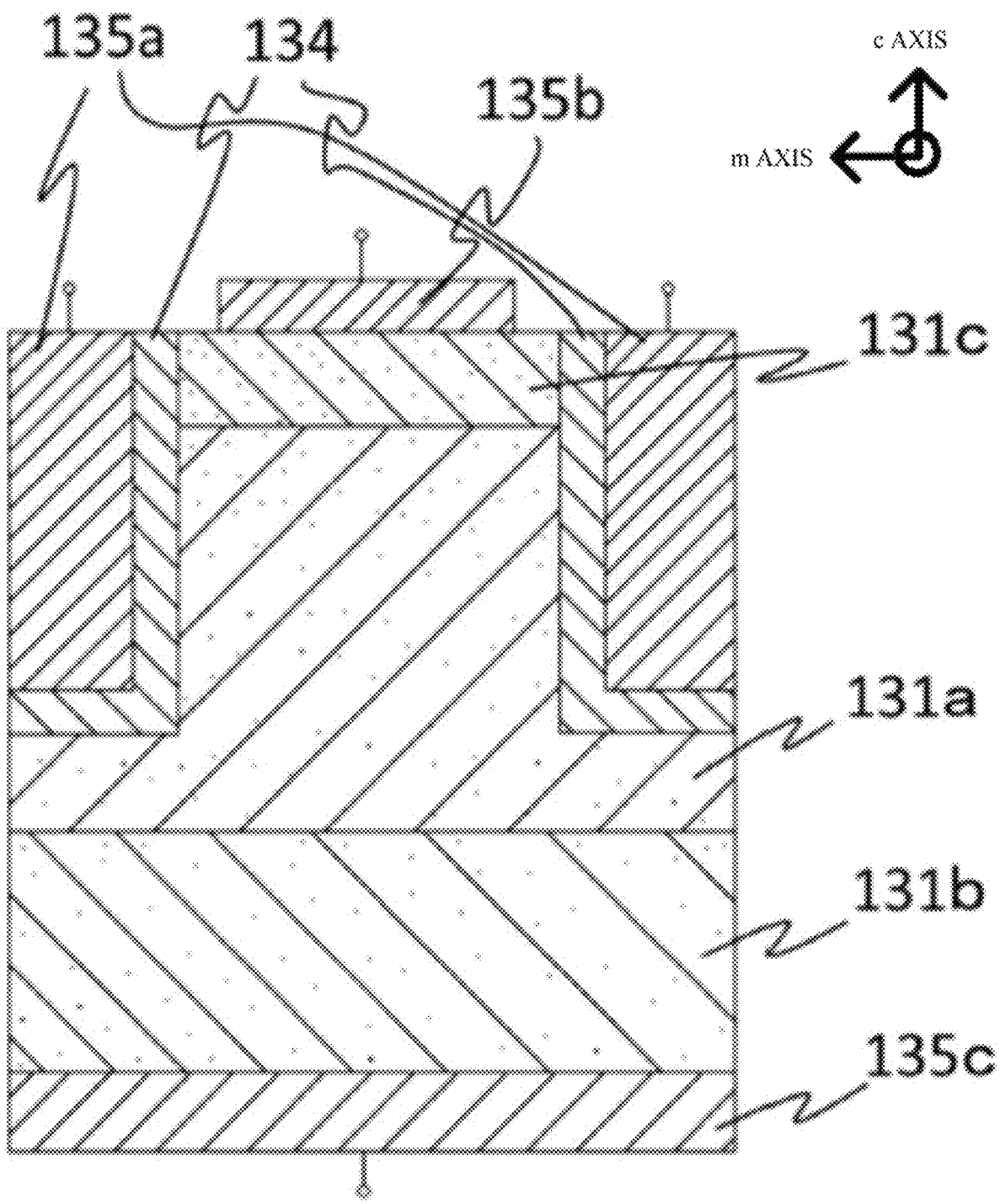
FIG. 7 is a view schematically illustrating a preferred example of a metal oxide semiconductor field-effect transistor (MOSFET) using a rectangular semiconductor layer and illustrating a sectional view in a lengthwise direction.

FIG. 7 illustrates an example of a case where the semiconductor device according to the disclosure is an MOSFET. The MOSFET in FIG. 7 is a trench-type MOSFET and includes an $n^-$-type semiconductor layer 131a, an $n^+$-type semiconductor layer 131b, an $n^+$-type semiconductor layer 131c, a gate insulating film 134, a gate electrode 135a, a source electrode 135b, and a drain electrode 135c.

The $n^+$-type semiconductor layer 131b is formed to a thickness from 100 nm to 100 μm, for example, on the drain electrode 135c. The $n^-$-type semiconductor layer 131a is formed to a thickness from 100 nm to 100 μm, for example, on the $n^+$-type semiconductor layer 131b. Furthermore, the $n^+$-type semiconductor layer 131c is formed on the $n^-$-type semiconductor layer 131a and the source electrode 135b is formed on the $n^+$-type semiconductor layer 131c.

A plurality of trenches penetrating the $n^+$-type semiconductor layer 131c is formed in the $n^-$-type semiconductor layer 131a and the $n^+$-type semiconductor layer 131c to a depth reaching an intermediate position of the $n^-$-type semiconductor layer 131a. The gate electrode 135a is embedded in the trench across the gate insulating film 134 having a thickness from 10 nm to 1 μm, for example.

For an ON state of the MOSFET in FIG. 7, by applying a voltage between the source electrode 135b and the drain electrode 135c and applying a voltage to the gate electrode 135a that is positive relative to the source electrode 135b, a channel layer is formed on a side surface of the $n^-$-type semiconductor layer 131a and electrons are injected into the $n^-$-type semiconductor layer 131a, thereby turning on the MOSFET. For an OFF state, a voltage at the gate electrode is set to 0 V to prevent formation of the channel layer. This brings the $n^-$-type semiconductor layer 131a in a state of being filled with a depletion layer to turn off the MOSFET.

Figure 8:
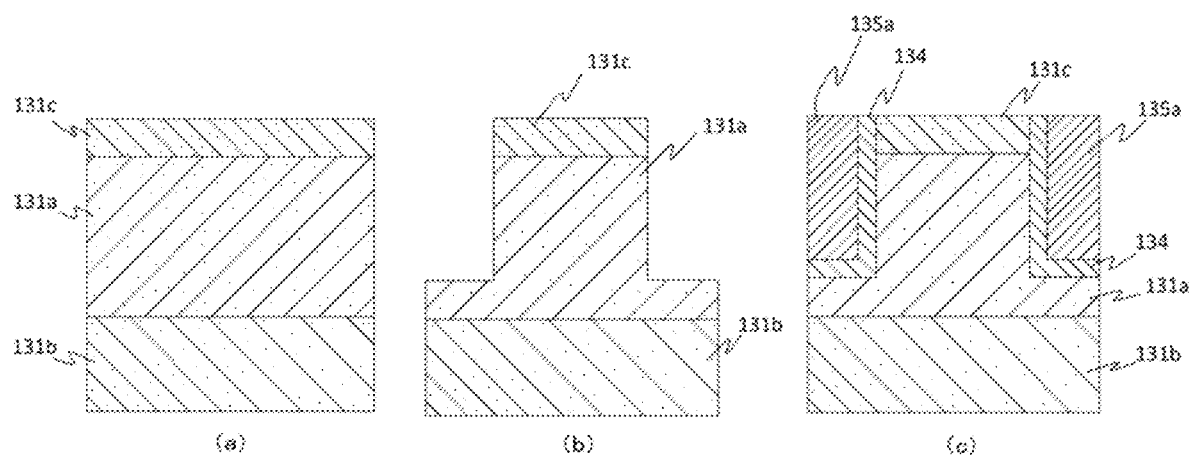
FIG. 8 is a schematic view for explaining some of steps of manufacturing the metal oxide semiconductor field-effect transistor (MOSFET) in FIG. 7.

FIG. 8 illustrates some of steps of manufacturing the MOSFET in FIG. 7. By using a semiconductor structure such as that illustrated in FIG. 8(a), for example, an etching mask is formed in predetermined regions in the $n^-$-type semiconductor layer 131a and the $n^+$-type semiconductor layer 131c. Then, using this etching mask as a mask, anisotropic etching is performed by a method such as reactive ion etching to form a trench of a depth starting from a surface of the $n^+$-type semiconductor layer 131c and reaching an intermediate position of the $n^-$-type semiconductor layer 131a, as illustrated in FIG. 8(b). Next, as illustrated in FIG. 8(c), using publicly-known means such as thermal oxidation, vacuum evaporation, sputtering, or CVD, the gate insulating film 134 is formed on the side surface and the bottom surface of the trench to a thickness from 50 nm to 1 μm, for example. Then, using a method such as CVD, vacuum evaporation, or sputtering, the gate electrode material 135a such as polysilicon, for example, is formed in the trench to a thickness of equal to or less than that of the $n^-$-type semiconductor layer.

Then, using publicly-known means such as vacuum evaporation, sputtering, or CVD, the source electrode 135b is formed on the n+-type semiconductor layer 131c and the drain electrode 135c is formed on the n+-type semiconductor layer 131b, thereby manufacturing a power MOSFET. A material of each of the source electrode and the drain electrode may be a publicly-known electrode material. Examples of this electrode material include metals such as Al, Mo, Co, Zr, Sn, Nb, Fe, Cr, Ta, Ti, Au, Pt, V, Mn, Ni, Cu, Hf, W, Ir, Zn, In, Pd, Nd, and Ag, alloys of these metals, conductive films made of metal oxides such as tin oxide, zinc oxide, indium oxide, indium tin oxide (ITO), and indium zinc oxide (IZO), organic conductive compounds such as polyaniline, polythiophene, and polypyrrole, and mixtures thereof.

The MOSFET obtained in this way achieves more excellent withstand voltage characteristics than a conventional trench-type MOSFET. While the example illustrated in FIG. 7 is the trench-type vertical MOSFET, the disclosure is not limited to this example but is applicable to various types of MOSFETs. For example, a series resistance may be reduced by forming the trench in FIG. 7 to a greater depth reaching the bottom surface of the n−-type semiconductor layer 131a. (IGBT)

Figure 9:
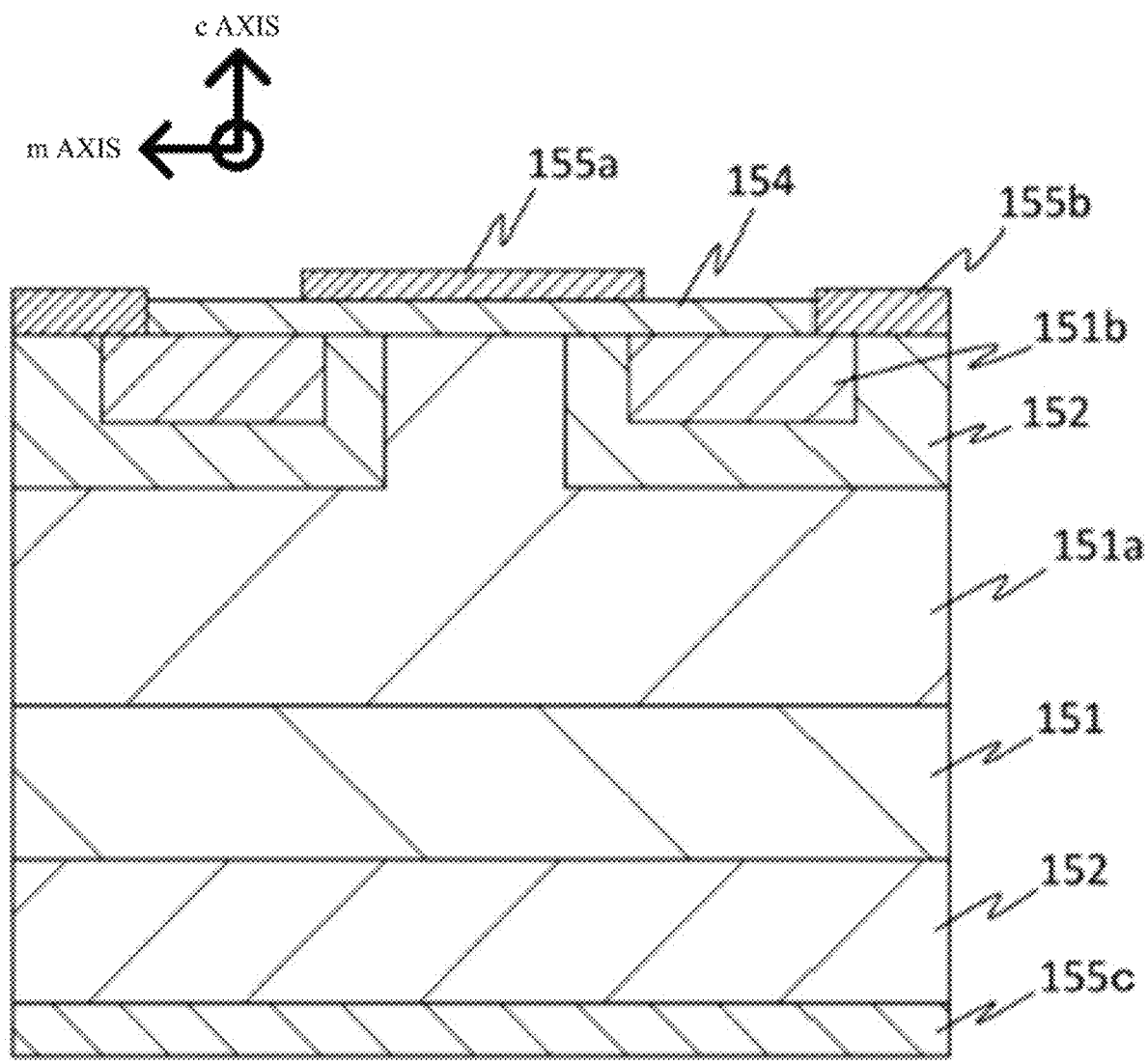
FIG. 9 is a view schematically illustrating a preferred example of an insulated gate bipolar transistor (IGBT) using a rectangular semiconductor layer and illustrating a sectional view in a lengthwise direction.

FIG. 9 illustrates a preferred example of an insulated gate bipolar transistor (IGBT) including an n-type semiconductor layer 151, an n−-type semiconductor layer 151a, an n+-type semiconductor layer 151b, a p-type semiconductor layer 152, a gate insulating film 154, a gate electrode 155a, an emitter electrode 155b, and a collector electrode 155c.

Figure 10:
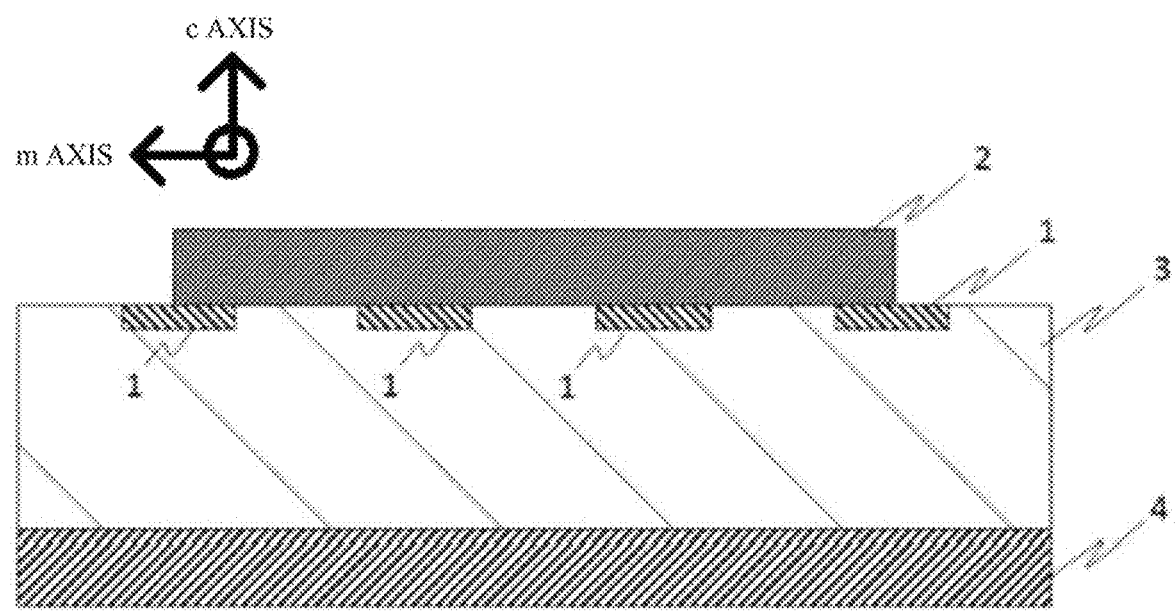
FIG. 10 is a view schematically illustrating a preferred example of a junction barrier Schottky diode (JBS) using a rectangular semiconductor layer and illustrating a sectional view in a lengthwise direction.

FIG. 10 illustrates a junction barrier Schottky diode (JBS) according to one preferred embodiment of the disclosure. The semiconductor device in FIG. 10 includes a semiconductor region (semiconductor layer) 3, a barrier electrode 2 provided on the semiconductor region and capable of forming a Schottky barrier with the semiconductor region, and a barrier height adjusting layer provided between the barrier electrode 2 and the semiconductor region 3 and capable of forming a Schottky barrier with the semiconductor region 3 to a greater barrier height than the barrier height of the Schottky barrier of the barrier electrode 2. The barrier height adjusting layer 1 is embedded in the semiconductor region 3. According to the disclosure, the barrier height adjusting layers 1 are preferably provided at regular intervals, and more preferably, the barrier height adjusting layer 1 are provided between both ends of the barrier electrode and the semiconductor region. Such a preferred embodiment provides the JBS with a configuration achieving more excellent thermal stability and adhesion, achieving further reduction in current leakage, and achieving more excellent semiconductor characteristics in terms of withstand voltage, etc. The semiconductor device in FIG. 10 further includes an Ohmic electrode 4 provided on the semiconductor region 3.

Means of forming each layer of the semiconductor device in FIG. 10 is not particularly limited but may be publicly-known means unless it interferes with the present disclosure. According to an example of applicable means, a film is deposited by vacuum evaporation, CVD, sputtering, or various types of coating techniques and then the film is patterned by photolithography. According to another example of applicable means, patterning is performed directly using a technique such as printing.

Figure 11:
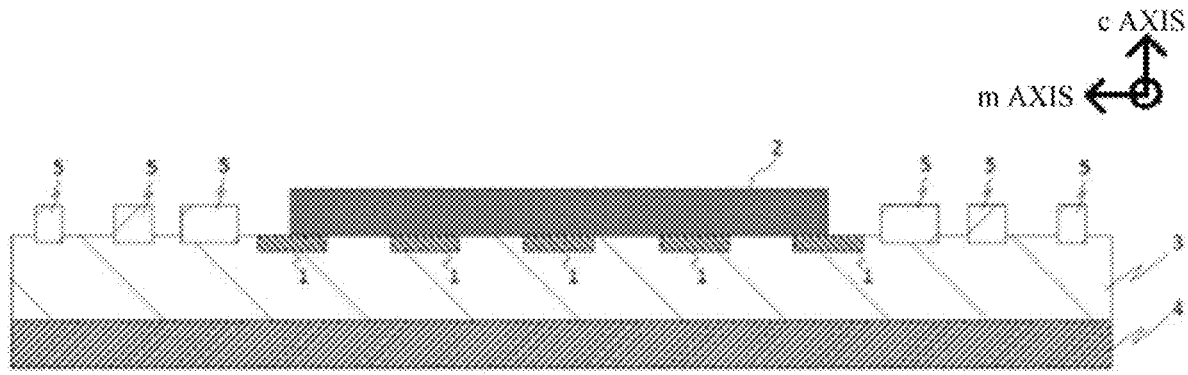
FIG. 11 is a view schematically illustrating a preferred example of a junction barrier Schottky diode (JBS) using a rectangular semiconductor layer and illustrating a sectional view in a lengthwise direction.

FIG. 11 illustrates a junction barrier Schottky diode (JBS) according to one preferred embodiment of the disclosure. The semiconductor device in FIG. 11 differs from the semiconductor device in FIG. 10 in that guard rings 5 are provided on an outer peripheral portion of the barrier electrode. This configuration makes it possible to provide a semiconductor device with more excellent semiconductor characteristics in terms of withstand voltage, etc. According to the disclosure, embedding a portion of each of the guard rings 5 into a surface of the semiconductor region (semiconductor layer) 3 makes it possible to more effectively achieve a more favorable withstand voltage. Furthermore, by using a metal of a high barrier height for the guard ring, it becomes possible to provide the guard ring industrially advantageously together with formation of the barrier electrode without affecting the semiconductor region seriously. This allows the guard ring to be formed without causing deterioration in an on-resistance.

A material with a high barrier height is generally used for the guard ring. Examples of the material used for the guard ring include a conductive material with a barrier height of equal to or greater than 1 eV. The material used as the guard ring may be the same as the electrode material described above. According to the disclosure, the material used for the guard ring is preferably the above-described metal as it provides higher flexibility in designing a withstand-voltage structure, increases the number of guard rings to be formed, and flexibly achieves a more favorable withstand voltage. The shape of the guard ring is not particularly limited but may be a square-shape, a circular shape, a channel-shape, an L-shape, or a band-shape. While the number of the guard rings is not particularly limited, it is preferably three or more, more preferably, six or more.

Figure 3:
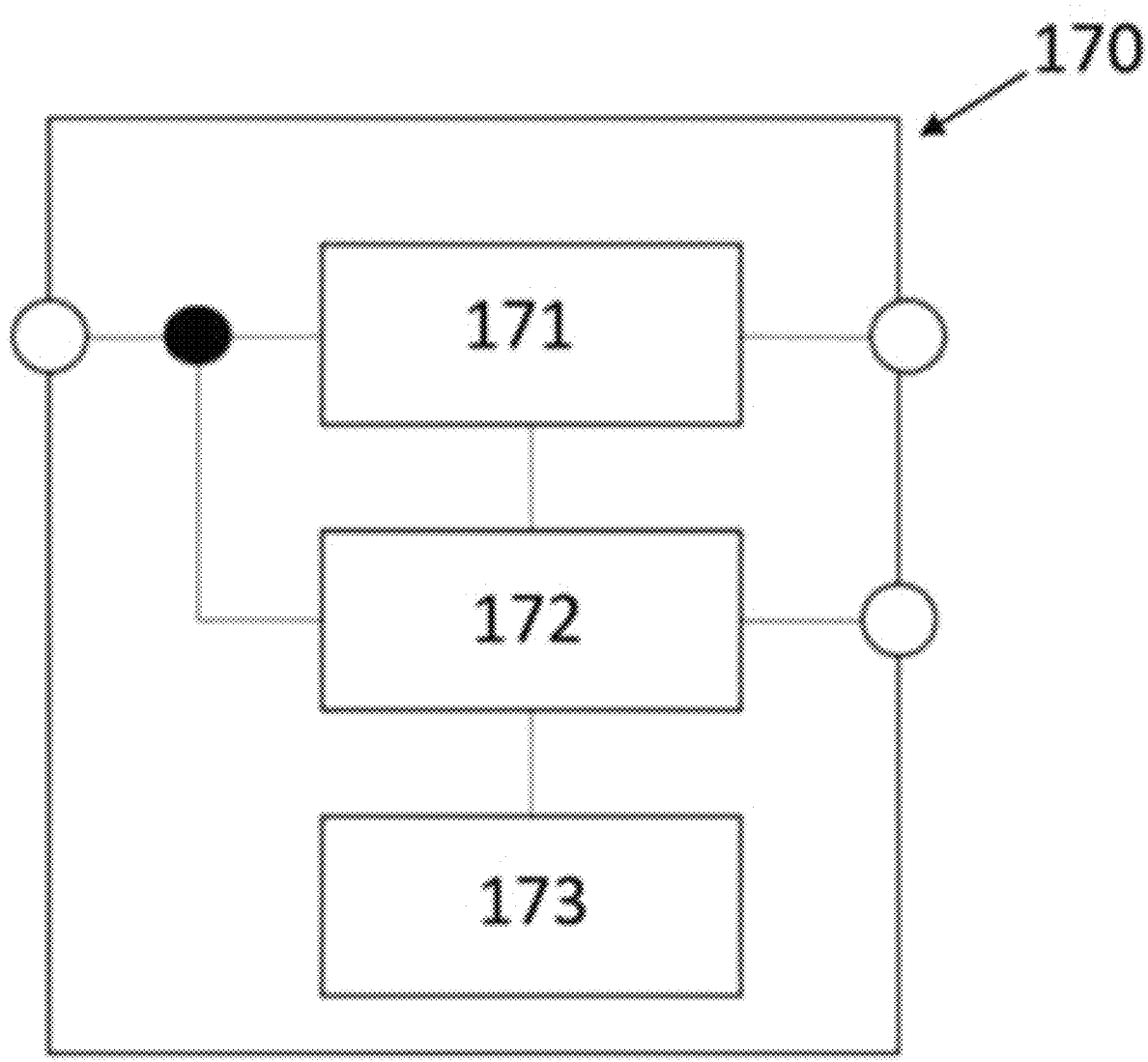
FIG. 3 is a view schematically illustrating a preferred example of a power source system.
Figure 4:
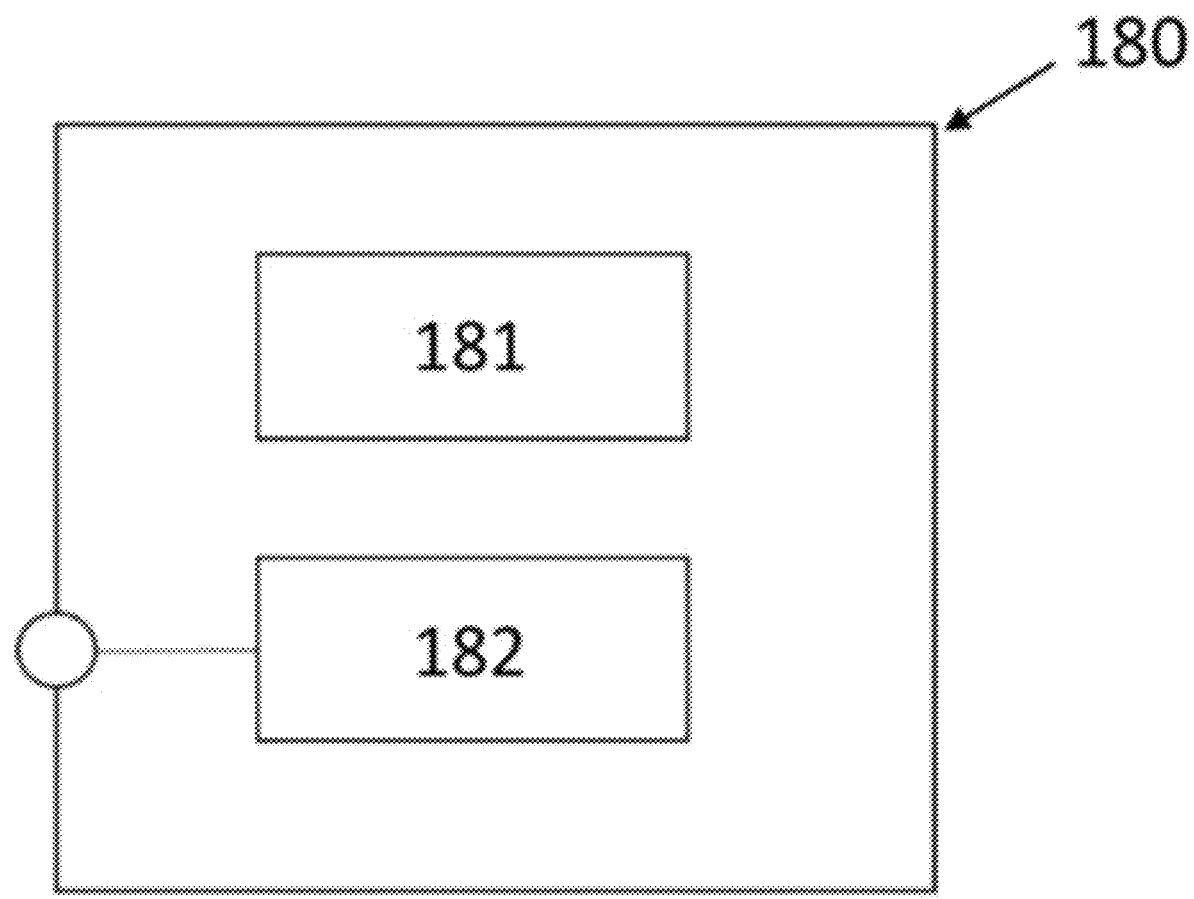
FIG. 4 is a view schematically illustrating a preferred example of a system device.
Figure 5:
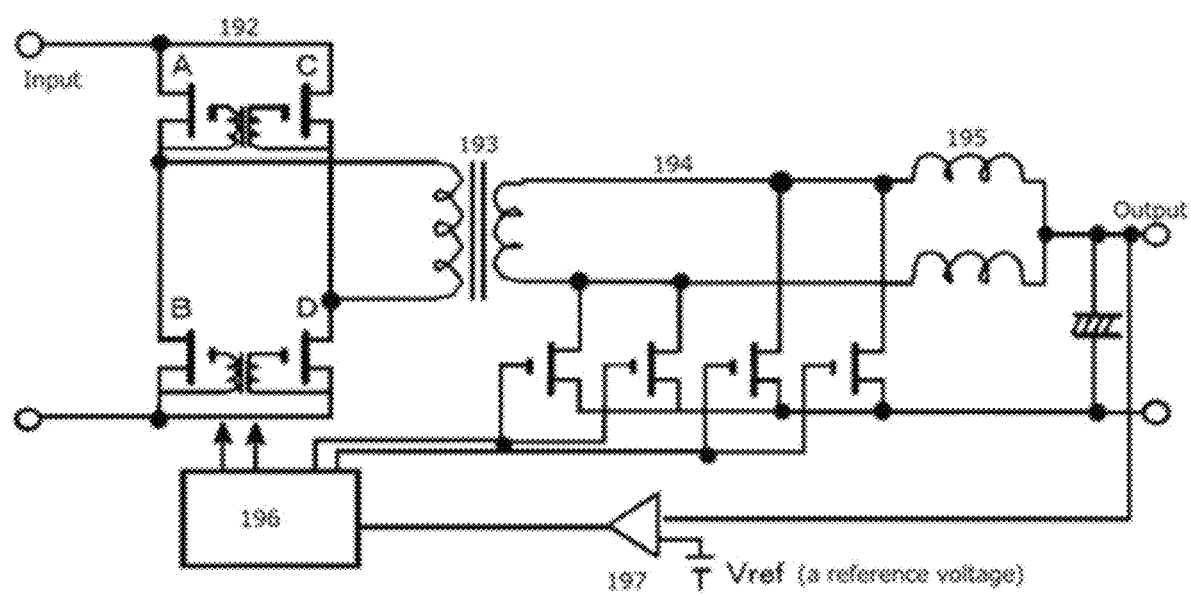
FIG. 5 is a view schematically illustrating a preferred example of a power source circuit diagram of a power source device.

In addition to the matters described above, the semiconductor device according to the disclosure is preferably used as a power module, an inverter, or a converter using a publicly-known method, and is also preferably used in a semiconductor system including a power source device, for example. The power source device may be provided from the semiconductor device or may be provided as the semiconductor device by being connected to a wiring pattern, for example, using a common method. In FIG. 3, a power source system 170 is configured using a plurality of such power source devices 171 and 172 and a control circuit 173. As illustrated in FIG. 4, the power source system is usable in a system device 180 including an electronic circuit 181 and a power source system 182 in combination. FIG. 5 illustrates an example of a power source circuit diagram of the power source device. FIG. 5 illustrates a power source circuit of a power source device including a power circuit and a control circuit. A DC voltage is switched and converted to AC at a high frequency by an inverter 192 (composed of MOSFETs A to D), and is then subjected to insulation and transformation by a transformer 193. The voltage is then rectified by rectification MOSFETs 194 (A to B') and then smoothed by a DCL 195 (smoothing coils L1 and L2) and a capacitor to output a direct current voltage. At this point, the output voltage is compared with a reference voltage by a voltage comparator 197 to control the inverter 192 and the rectification MOSFETs 194 using a PWM control circuit 196, thereby obtaining a desired output voltage.

Figure 12:
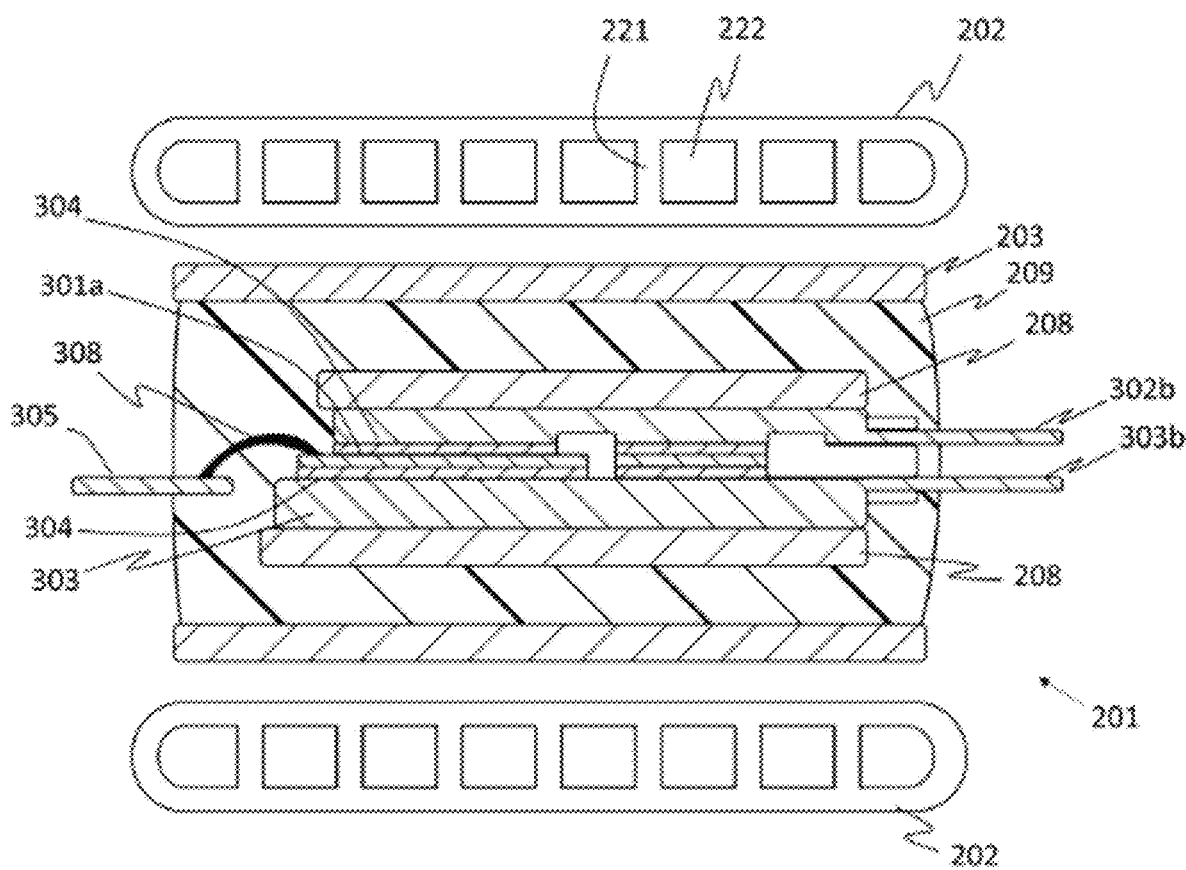
FIG. 12 is a view schematically illustrating a preferred example of a power card.

According to the disclosure, the semiconductor device is preferably a power card. More preferably, the power card includes a cooler and an insulating member and the cooler is provided on each of both sides of the semiconductor layer across at least the insulating member. Most preferably, a heat dissipation layer is provided on each of the both sides of the semiconductor layer and the cooler is provided external to the heat dissipation layer across at least the insulating member. FIG. 12 illustrates a power card according to one preferred embodiment of the disclosure. The power card in FIG. 12 is a double-sided cooling power card 201 including a coolant tube 202, a spacer 203, an insulating plate (insulating spacer) 208, a resin sealing part 209, a semiconductor chip 301a, a metal heat transfer plate (projecting terminal part) 302b, a heat sink and electrode 303, a metal heat transfer plate (projecting terminal part) 303b, a solder layer 304, a control electrode terminal 305, and a bonding wire 308. The coolant tube 202 has a section in a thickness direction provided with a large number of flow paths 222 separated with a large number of partitions 221 arranged at intervals therebetween and extending in a flow path direction. This preferred power card achieves higher heat dissipation performance and fulfills higher reliability.

The semiconductor chip 301a is joined to an inner principal plane of the metal heat transfer plate 302b with the solder layer 304. The metal heat transfer plate (projecting terminal part) 302b is joined to the residual principal plane of the semiconductor chip 301a with the solder layer 304. By doing so, an anode electrode surface and a cathode electrode surface of a flywheel diode are connected in so-called inverse-parallel to a collector electrode surface and an emitter electrode surface of an IGBT. The metal heat transfer plates (projecting terminal parts) 302b and 303b are made of a material that is Mo or W, for example. The metal heat transfer plates (projecting terminal parts) 302b and 303b have a difference in thickness with which a difference in thickness of semiconductor chips 301a is absorbed to define an outer surface of the metal heat transfer plate 302b and 303b as a flat surface.

The resin sealing part 209 is made of epoxy resin, for example, and is molded while covering side surfaces of the metal heat transfer plates 302b and 303b. The semiconductor chip 301a is molded with the resin sealing part 209. Outer principal planes, namely, heat-receiving contact surfaces of the metal heat transfer plates 302b and 303b are completely exposed. The metal heat transfer plates (projecting terminal parts) 302b and 303b project rightward from the resin sealing part 209 in FIG. 12. The control electrode terminal 305 that is a so-called lead frame terminal forms connection between a gate (control) electrode surface and the control electrode terminal 305 of the semiconductor chip 301a where an IGBT is formed, for example.

While the insulating plate 208 as an insulating spacer is composed of an aluminum nitride film, for example, it may be a different insulating film. The insulating plate 208 tightly contacts the metal heat transfer plates 302b and 303b while covering the metal heat transfer plates 302b and 303b completely. Alternatively, the insulating plate 208 may simply contact the metal heat transfer plates 302b and 303b, or a member to transfer heat favorably such as silicone grease may be applied. Various methods are applicable to form a joint therebetween. An insulating layer may be formed by ceramic spraying, for example. The insulating plate 208 may be joined onto the metal heat transfer plate or may be joined onto or formed on the coolant tube.

The coolant tube 202 is prepared by cutting a plate material formed by pultrusion molding or extrusion molding on an aluminum alloy into a required length. The section in a thickness direction of the coolant tube 202 includes the large number of flow paths 222 separated with the large number of partitions 221 arranged at intervals therebetween and extending in the flow path direction. The spacer 203 may be a soft metal plate such as a solder alloy, for example. The spacer 203 may also be a film (coating) formed on the contact surfaces of the metal heat transfer plates 302b and 303b by coating, for example. The soft spacer 203 has a surface that is easy to deform and is adaptable to fine irregularities or distortion of the insulating plate 208 and to fine irregularities or distortion of the coolant tube 202, thereby reducing thermal resistance. A publicly-known member to transfer heat favorably such as grease may be applied, for example to a surface of the spacer 203. The spacer 203 is omissible.

Test Examples 1 to 3

Figure 13:
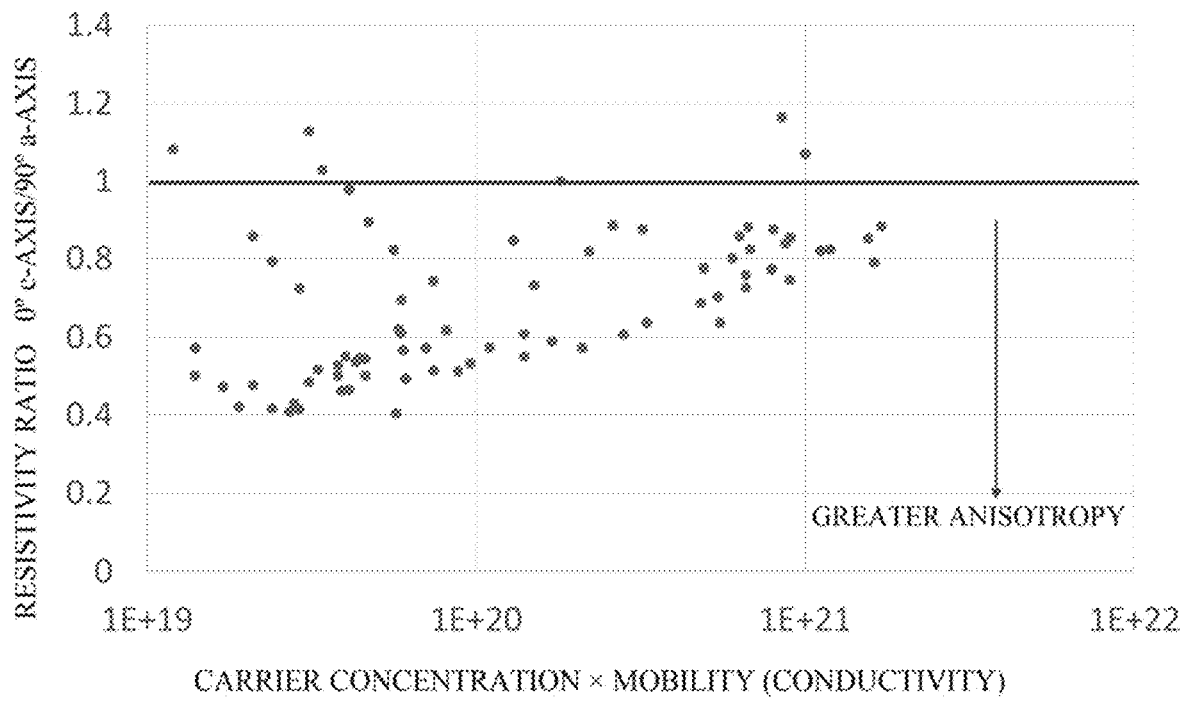
FIG. 13 is a view illustrating result of a test example 1.
Figure 14:
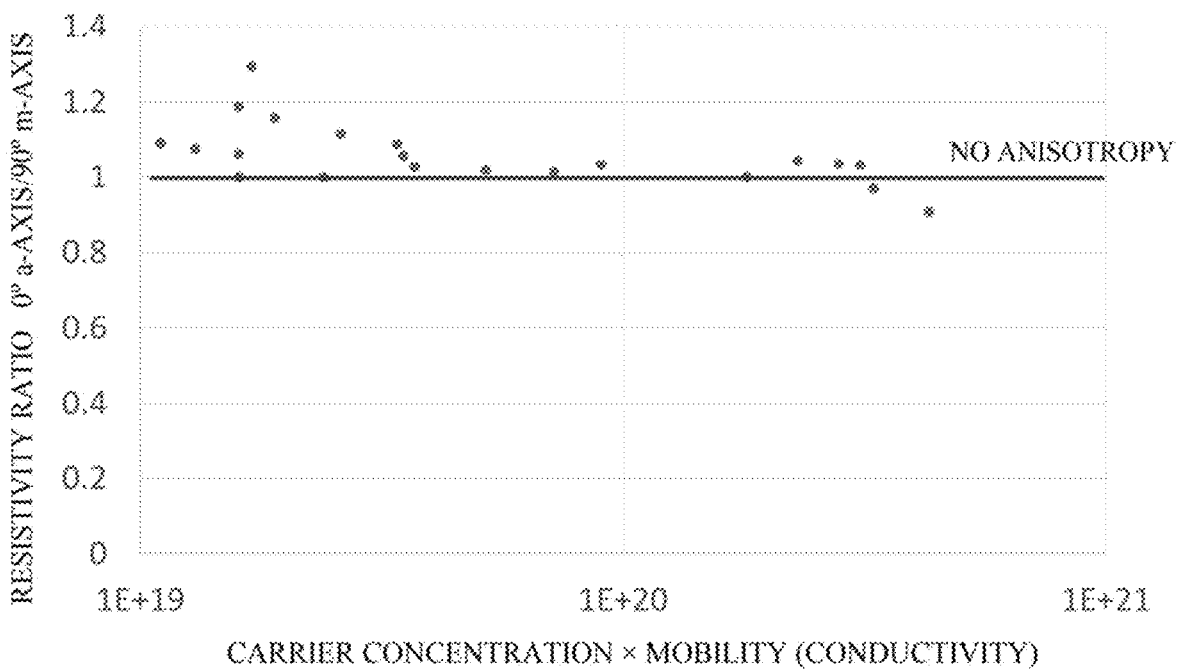
FIG. 14 is a view illustrating result of a test example 2.

An m-plane α-$Ga_2O_3$ semiconductor film and a c-plane α-$Ga_2O_3$ semiconductor film were deposited using a mist CVD method. Then, using a terahertz spectral device (general-purpose terahertz spectral device "TerapProspector (registered trademark, trademark registration No. 5550188)" (2019) available from NIPPO PRECISION Co. Ltd.), a relationship between an electrical resistivity and carrier concentration×mobility (conductivity) was analyzed to evaluate anisotropy between a c-axis and an a-axis. Results thereof are illustrated in FIG. 13 (test example 1) and FIG. 14 (test example 2). As clearly understood from FIGS. 13 and 14, anisotropy by which the resistivity becomes lower in the c-axis direction was observed. Anisotropy by which the resistivity slightly becomes lower along an m-axis was also observed. Furthermore, a carrier concentration about each sample in the test example 1 was examined using a Hall effect measuring device and results illustrated in FIG. 15 (test example 3) were obtained. These results show that a lower carrier concentration results in greater anisotropy.

The semiconductor device according to the disclosure is available in any field including semiconductors (e.g., compound semiconductor electronic devices), electronic parts, electric equipment parts, optical electrophotographic related apparatuses, industrial members, and especially useful for power devices.

The embodiments of the present invention are exemplified in all respects, and the scope of the present invention includes all modifications within the meaning and scope equivalent to the scope of claims.

REFERENCE SIGNS LIST

1 Barrier height adjusting layer
2 Barrier electrode
3 Semiconductor region (semiconductor layer)
4 Ohmic electrode
5 Guard ring
19 Mist apparatus (deposition apparatus)
20 Substrate
21 Susceptor
22a Carrier gas supply means
22b Carrier gas (diluted) supply means
23a Flow control valve
23b Flow control valve
24 Mist generator
24a Raw material solution
25 Container
25a Water
26 Ultrasonic transducer
27 Supply pipe
28 Heater
29 Exhaust port
30 Deposition chamber
101a n$^-$-type semiconductor layer
101b n$^+$-type semiconductor layer
105a Schottky electrode
105b Ohmic electrode
131a n$^-$-type semiconductor layer
131b First n$^+$-type semiconductor layer 131c Second n⁺-type semiconductor layer
134 Gate insulating film
135x Gate electrode
135b Source electrode
135c Drain electrode
151 n-type semiconductor layer
151a n⁻-type semiconductor layer
151b n⁺-type semiconductor layer
152 p-type semiconductor layer
154 Gate insulating film
155a Gate electrode
155b Emitter electrode
155c Collector electrode
170 Power source system
171 Power source device
172 Power source device
173 Control circuit
180 System device
181 Electronic circuit
182 Power source system
192 Inverter
193 Transformer
194 Rectification MOSFET
195 DCL
196 PWM control circuit
197 Voltage comparator
201 Double-sided cooling power card
202 Coolant tube
203 Spacer
208 Insulating plate (insulating spacer)
209 Resin sealing part
221 Partition
222 Flow path
301a Semiconductor chip
302b Metal heat transfer plate (projecting terminal part)
303 Heat sink and electrode
303b Metal heat transfer plate (projecting terminal part)
304 Solder layer
305 Control electrode terminal
308 Bonding wire

What is claimed is:

1. A semiconductor device comprising:
at least a semiconductor layer having a corundum structure, wherein
the semiconductor layer includes a first surface having at least a first side and a second side shorter than the first side,
the first surface is a c-plane, and
a direction of the first side is a direction of an m-axis.

2. The semiconductor device according to claim 1, wherein
the semiconductor layer contains a metal oxide including at least one metal selected from gallium, indium, rhodium, and iridium.

3. The semiconductor device according to claim 1, wherein
the semiconductor layer contains a metal oxide including at least gallium as a major component.

4. The semiconductor device according to claim 1, wherein
the semiconductor layer has a carrier concentration of equal to or less than $1 \times 10^{19}/cm^3$.

5. The semiconductor device according to claim 1, wherein
the semiconductor device is a power device.

6. The semiconductor device according to claim 5, wherein
the semiconductor device is a power module, an inverter, or a converter.

7. The semiconductor device according to claim 5, wherein
the semiconductor device is a power card.

8. The semiconductor device according to claim 7, further comprising:
a cooler and an insulating member, wherein
the cooler is provided on each of both sides of the semiconductor layer across at least the insulating member.

9. The semiconductor device according to claim 8, further comprising:
a heat dissipation layer provided on each of the both sides of the semiconductor layer, wherein
the cooler is provided external to the heat dissipation layer across at least the insulating member.

10. A semiconductor system comprising a semiconductor device,
the semiconductor device being the semiconductor device according to claim 1.

11. The semiconductor device according to claim 1, wherein
each of the first side and the second side is a line forming a boundary of the first surface.

12. A semiconductor device comprising:
at least a semiconductor layer having a corundum structure, wherein
the semiconductor layer includes a first surface having at least a first side and a second side shorter than the first side,
the first surface is an m-plane, and
a direction of the first side is a direction of a c-axis.

13. The semiconductor device according to claim 12, wherein
each of the first side and the second side is a line forming a boundary of the first surface.

* * * * *